United States Patent
Fetter et al.

(10) Patent No.: US 6,524,971 B1
(45) Date of Patent: Feb. 25, 2003

(54) METHOD OF DEPOSITION OF FILMS

(75) Inventors: Linus Albert Fetter, Morganville, NJ (US); John Z. Pastalan, Hampton, NJ (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 09/465,633

(22) Filed: Dec. 17, 1999

(51) Int. Cl.$^7$ .............................................. H02L 21/469

(52) U.S. Cl. .................................................... 438/778

(58) Field of Search ................................ 438/381, 387, 438/388, 396, 758, 778, 785, 424

(56) References Cited

U.S. PATENT DOCUMENTS

| | | | |
|---|---|---|---|
| 2,303,457 A | 12/1942 | Harding et al. | 172/239 |
| 3,958,263 A | 5/1976 | Panish et al. | 357/18 |
| 4,048,438 A | 9/1977 | Zimmerman | 174/68.5 |
| 4,502,932 A | 3/1985 | Kline et al. | 204/192 EC |
| 4,556,812 A | 12/1985 | Kline et al. | 310/324 |
| 4,606,936 A | 8/1986 | Bajor et al. | 427/85 |
| 4,719,155 A | 1/1988 | Matsumoto | 428/700 |
| 4,719,383 A | 1/1988 | Wang et al. | 310/324 |
| 4,890,370 A | 1/1990 | Fukuda et al. | 29/25.35 |
| 4,950,558 A | 8/1990 | Sarin | 428/698 |
| 4,988,957 A | 1/1991 | Thompson et al. | 331/107 A |
| 5,035,923 A | * 7/1991 | Sarin | 427/255 |
| 5,061,574 A | 10/1991 | Henager et al. | 428/620 |
| 5,075,641 A | 12/1991 | Weber et al. | 331/108 C |
| 5,156,909 A | 10/1992 | Henager et al. | 428/334 |
| 5,166,646 A | 11/1992 | Avanic et al. | 331/107 A |
| 5,185,589 A | 2/1993 | Krishnaswamy et al. | 333/133 |
| 5,185,689 A | * 2/1993 | Maniar | 361/313 |
| 5,231,327 A | 7/1993 | Ketcham | 310/366 |
| 5,232,571 A | 8/1993 | Braymen | 204/192.22 |
| 5,233,259 A | 8/1993 | Krishnaswamy et al. | 310/324 |
| 5,283,458 A | 2/1994 | Stokes et al. | 257/416 |
| 5,291,159 A | 3/1994 | Vale | 333/188 |
| 5,294,898 A | 3/1994 | Dworsky et al. | 333/187 |
| 5,334,960 A | 8/1994 | Penunuri | 333/193 |
| 5,348,617 A | 9/1994 | Braymen | 156/644 |
| 5,367,308 A | 11/1994 | Weber | 343/700 |
| 5,373,268 A | 12/1994 | Dworsky et al. | 333/187 |
| 5,381,385 A | 1/1995 | Greenstein | 367/140 |

(List continued on next page.)

OTHER PUBLICATIONS

IBM ("Voidless Final Closure Process for Polysilicon Trench", vol. 28, No. 10, Mar. 1986).*

Manuel, P.N., et al.; *Residual Stress in SiO2 Film*, Jul., 1996, Abstracts of 41$^{st}$ Annual Conference of the South African Institute of Physics at University of Pretoria.

Makhele, L, et al.; *Inhibition of Stress corrosion Cracking Using Ion Implantation*, Jul., 1996, Abstracts of 41$^{st}$ Annual Conference of the South African Institute of Physics at University of Pretoria.

Pang, W., et al.; *Surface Acoustic Wave Velocities in Stressed TiNx Coatings from Brillouin Scattering*, Jul., 1996, Abstracts of 41$^{st}$ Annual Conference of the South African Institute of Physics at University of Pretoria.

(List continued on next page.)

*Primary Examiner*—Michael Sherry
*Assistant Examiner*—Lisa Kilday

(57) ABSTRACT

The invention presents a deposition method which varies the growth conditions of a film on a patterned substrate. For example, deposition conditions required for obtaining growth are determined for each of the substrate's component surfaces. Film deposition begins under the conditions used to deposit material on one of the substrate materials. Then, the growth parameters are adjusted towards desired conditions for the other substrate material as another small amount of material is deposited. The adjustment and subsequent deposition is repeated until the desired conditions for growth on the second material are met. Growth of the remainder of the film then continues under the desired deposition conditions for growth on the second material.

15 Claims, 2 Drawing Sheets

U.S. PATENT DOCUMENTS

| | | | |
|---|---|---|---|
| 5,403,701 A | 4/1995 | Lum et al. ................... 430/315 |
| 5,404,628 A | 4/1995 | Ketcham ................... 29/25.35 |
| 5,438,554 A | 8/1995 | Seyed-Bolorforosh et al. .......................... 367/140 |
| 5,442,223 A | 8/1995 | Fujii .......................... 257/506 |
| 5,446,306 A | 8/1995 | Stokes et al. ............... 257/416 |
| 5,492,843 A * | 2/1996 | Adachi et al. .............. 438/974 |
| 5,552,655 A | 9/1996 | Stokes et al. ............... 310/330 |
| 5,587,620 A | 12/1996 | Ruby et al. ................. 310/346 |
| 5,596,239 A | 1/1997 | Dydyk ....................... 310/311 |
| 5,617,065 A | 4/1997 | Dydyk ....................... 333/186 |
| 5,630,949 A | 5/1997 | Lakin .......................... 216/61 |
| 5,646,583 A | 7/1997 | Seabury et al. ............. 333/187 |
| 5,692,279 A | 12/1997 | Mang et al. ............... 29/25.35 |
| 5,698,928 A | 12/1997 | Mang et al. ............... 310/322 |
| 5,702,775 A | 12/1997 | Anderson et al. .............. 428/1 |
| 5,714,917 A | 2/1998 | Ella .......................... 332/144 |
| 5,750,211 A | 5/1998 | Weise ......................... 427/579 |
| 5,751,753 A | 5/1998 | Uchida ........................ 372/45 |
| 5,760,663 A | 6/1998 | Pradal ........................ 333/187 |
| 5,770,023 A | 6/1998 | Sellers ................... 204/192.3 |
| 5,780,713 A | 7/1998 | Ruby .......................... 73/1.82 |
| 5,789,845 A | 8/1998 | Wadaka et al. ............. 310/334 |
| 5,810,924 A | 9/1998 | Legoues et al. .............. 117/89 |
| 5,821,833 A | 10/1998 | Lakin .......................... 333/187 |
| 5,853,601 A | 12/1998 | Krishaswamy et al. ........ 216/2 |
| 5,858,086 A | 1/1999 | Hunter ........................ 117/84 |
| 5,864,261 A | 1/1999 | Weber ........................ 333/187 |
| 5,872,493 A | 2/1999 | Ella .......................... 333/191 |
| 5,873,153 A | 2/1999 | Ruby et al. ................ 29/25.35 |
| 5,873,154 A | 2/1999 | Ylilammi et al. .......... 29/25.35 |
| 5,883,575 A | 3/1999 | Ruby et al. .............. 340/572.5 |
| 5,884,378 A | 3/1999 | Dydyk ....................... 29/25.35 |
| 5,894,647 A | 4/1999 | Lakin ......................... 29/25.35 |
| 5,901,165 A | 5/1999 | Uchida ........................ 372/45 |
| 5,910,756 A | 6/1999 | Ella .......................... 333/133 |
| 5,928,598 A | 7/1999 | Anderson et al. ............ 264/446 |
| 5,942,958 A | 8/1999 | Lakin .......................... 333/189 |
| 5,963,856 A | 10/1999 | Kim .......................... 455/307 |
| 6,051,907 A | 4/2000 | Ylilammi .................... 310/312 |
| 6,060,818 A | 5/2000 | Ruby et al. ................. 310/363 |
| 6,081,171 A | 6/2000 | Ella .......................... 333/189 |
| 6,087,198 A | 7/2000 | Panasik ....................... 438/51 |
| 6,127,768 A | 10/2000 | Stoner et al. ........... 310/313 A |
| 6,150,703 A | 11/2000 | Cushman et al. ........... 257/415 |
| 6,198,208 B1 | 3/2001 | Yano et al. ................. 310/358 |
| 6,204,737 B1 | 3/2001 | Ella .......................... 333/187 |
| 6,215,375 B1 | 4/2001 | Larson, III et al. ......... 333/187 |
| 6,239,536 B1 * | 5/2001 | Lakin ......................... 310/364 |
| 6,306,313 B1 * | 10/2001 | Fetter et al. ................ 438/734 |

OTHER PUBLICATIONS

Nabarro, F.R.N, et al.; *Thermal Activation Under Stress: Is the Becker Model Relevant?*, Jul., 1996, Abstracts of 41$^{st}$ Annual Conference of the South African Institute of Physics at Unversity of Pretoria.

Finot, A., et al.; *Small and Large Deformation of Thick and Thin–Film Multi–Layers: Effects of Layer Geometry, Plasticity and Compositional Gradients*, 1996, pp. 683–721, J. Mech. Phys. Solids vol. 44, No. 5.

Okamoto, M., et al.; *Aluminum Nitride Thin Films Grown by Plasma–Assisted Pulsed Laser Deposition on Si Substrates*; 1997, pp. 87–92, Mat. Res. Soc. Symp. Proc. vol. 468.

Kesler, O., et al.; *Determination of Processing–Induced Stresses and Properties of Layered and Graded Coatings: Experimental Method and Results for Plasma–Sprayed Ni–Al$_2$O$_3$*, 1997, pp. 3123–3134, Acta mater, vol. 45, No. 8.

Rossnagel, S.M.; *Sputter Deposition for Semiconductor Manufacturing*, 1999, pp. 163–179, IBM.

* cited by examiner

METHOD OF DEPOSITION OF FILMS

FIELD OF THE INVENTION

The invention pertains to the field of electronic device fabrication. More particularly, the invention pertains to a method of depositing films.

BACKGROUND OF THE INVENTION

A common step in electronic device manufacturing is the deposition of a thin film over a substrate or over another film on the substrate. Multiple depositions contribute to the complexity and functionality of the electronic device. However, deposition of one material onto another frequently causes residual stress in one or both materials during fabrication.

Stresses Involved in Deposition

Thin films encounter residual stress, which determines the reliability of these films. Residual stress leads to failure of the films due to delamination, cracking or voiding. Both thermal stress and intrinsic stress contribute to residual stress. Thermal stress occurs when there is a difference in expansion between the materials as the temperature changes, thus causing strain between them. Intrinsic stress is caused by film growth processes. These stresses lead to destructive effects such as cracking and delamination of the film. This reaction to stress occurs in large part due to tensile stresses which are established in the outermost surface of the films. These stresses, should they exceed the fracture strength of the film, cause a fracture in the film. Decreasing these intrinsic stresses during deposition of materials is essential to reliable and economical film processing.

One type of stress addressed in the prior art is encountered during growth of materials, and is caused by lattice mismatch. This phenomenon occurs when the lattice structure of one material does not match the lattice structure of another with which it has direct physical contact. The differences in lattice structure cause mismatch, resulting in strain and growth-incurred defects.

Solutions have been presented to alleviate the problems encountered with lattice mismatch. For example, grading techniques are used to repair lattice mismatches in which intermediate buffer layers are placed between two layers which are not lattice matched to provide structures having reduced defects due to the mismatch. In addition, other layers with a graded composition can be used between two layers which are not lattice matched.

As an example, in U.S. Pat. No. 5,751,753 (Uchida '753) and U.S. Pat. No. 5,901,165 (Uchida '165), a buffer layer consists of a graded composition. The buffer layer lies on an underlying layer. The underlying layer has a lattice constant substantially different from an upper level semiconductor layer. The buffer layer has a lattice constant which gradually changes from the lattice constant of the first layer to that of the lattice constant of the second layer and relaxes lattice mismatch in a semiconductor laser. The gradual changes in the lattice constant of the buffer layer allow the upper level semiconductor layer to be grown on the buffer layer.

The Uchida '753 and Uchida '165 patents do not attempt to solve the problem of the unique stresses encountered during deposition onto a patterned substrate. The graded buffer layer discussed in Uchida '753 and Uchida '165 is designed to separate two layers of material which would otherwise encounter stress. In addition, Uchida '753 and Uchida '165 are not concerned with deposition onto a substrate that has already been patterned.

In U.S. Pat. No. 5,035,923 (Sarin '923), a continuous deposition process is disclosed in which the reactant gases used gradually change from the reactants required for one layer of the coating to the reactants required for another layer. The coating disclosed in Sarin '923 includes at least two layers. The first layer consists of aluminum nitride or aluminum oxynitride deposited over a silicon-based ceramic substrate as an intermediate layer. At least one outer oxide layer with protective and surface properties is deposited over the intermediate layer.

Although the Sarin '923 patent discloses a stress resistant coating, the grading discussed is directed to the composition of the layer being deposited. The coating itself is a graded composition, including at least two different materials. This coating process is not designed to deposit a homogeneous layer of one material on a substrate. In addition, the issue of patterned substrates is not addressed in the patent.

A number of deposition parameters affect film stress, including system background pressure, substrate bias, gas ratio (noble/reactive), input power, the morphology of the substrate, the source to substrate distance, substrate temperature, type of magnetron source (fixed or rotating), gas delivery, pumping speed and loading mechanisms. In the case of pulsed DC deposition, a specific type of deposition whereby pulsed current is used during the deposition, additional parameters such as pulse width, magnitude, and frequency also influence film stress.

Though the list of parameters which affect stress can be extensive, at the core is how these parameters influence the kinetic energy with which the material's ions and molecules strike the substrate surface. For example, lower background pressure increases the interaction distance between molecules and ions (Debye length), thus allowing an increase in their kinetic energy. This increase in the molecule's impact energy causes the film to be compacted along the growth direction, resulting in a force directed perpendicular to the growth direction and tangential to the surface. If the tangential force is sufficiently high to overcome the adhesion of the layer to the substrate, the film detaches and curls to relieve the stress. Similar arguments apply to the effect of substrate bias, for example, where the applied electric field again serves to increase an ion's kinetic energy.

Complicating the solution to the problem is the fact that film stress is a function of the material upon which it is grown. For example, stresses can vary by orders of magnitude depending upon whether aluminum nitride is grown on silicon or aluminum. For an unpatterned substrate with a homogeneous surface, known deposition parameters are used to control film stress. However, most applications require that the material be grown on a patterned substrate. For example, aluminum electrodes are frequently formed on a silicon substrate before depositing aluminum nitride. With such patterned substrates, low stress growth conditions for one material generally do not match those of the other material, thereby resulting in undesirably stressed films on one surface or the other.

Properties of Aluminum Nitride

One film material that has characteristics suitable for electronic device manufacture is aluminum nitride (AlN). Aluminum nitride possesses desirable electronic, optical, and thermal properties. Among the useful properties of aluminum nitride are its piezoelectric response, its high thermal conductivity, its close thermal expansion match to a silicon substrate, and its good mechanical strength. Therefore, successful deposition of aluminum nitride onto a patterned substrate is essential for further development of advanced electronic devices.

However, in order to deposit aluminum nitride on a patterned substrate, resultant film stress must be taken into consideration. None of the prior art addresses the problem of stresses encountered during deposition of a material such as aluminum nitride on a patterned substrate. A method to successfully alleviate stress on each component of a patterned substrate is needed in order to improve the deposition process.

SUMMARY OF THE INVENTION

The invention presents a deposition method which varies the growth conditions of a film on a patterned substrate. For example, deposition conditions required for obtaining growth are determined for each of the substrate's component surfaces. Film deposition begins under the conditions used to deposit material on one of the substrate materials. Then, the growth parameters are adjusted towards desired conditions for the other substrate material as another small amount of material is deposited. The adjustment and subsequent deposition is repeated until the desired conditions for growth on the second material are met. Growth of the remainder of the film then continues under the desired deposition conditions for growth on the second material.

DESCRIPTION OF THE PREFERRED EMBODIMENT

The deposition of thin films is a fundamental technology underlying electronic device fabrication. Among the issues facing this technology is the fact that such films may grow with intrinsic stress; i.e., tangential forces which, if sufficiently severe, can cause delamination of the film from its supporting substrate. This intrinsic stress level is dependent upon the materials involved (film material and substrate), and can vary by orders of magnitude for the same film deposited on two different substrates.

As a means of controlling these stresses, a number of process parameters can be adjusted during a film's deposition. Some of the possible deposition conditions to be varied include background pressure, substrate bias, gas ratio (noble-to-reactive), input power, substrate morphology, source to substrate distance, substrate temperature, gas delivery, and pumping speed. In the case of pulsed DC deposition, a specific type of deposition whereby pulsed current is used during the deposition, additional parameters such as pulse width, magnitude, and frequency also influence film stress. When developing a process, practitioners may adjust one or more of these parameters to control the intrinsic stress on a given substrate.

The stress problem is complicated when films are deposited on a substrate whose surface is composed of two or more materials, as, for example, a silicon substrate with patterned aluminum electrodes. In such a case, deposition conditions which minimize film stress on one surface most often do not match the conditions of the other surface. The method described here addresses this problem by grading stress during growth of the homogeneous film. In this procedure, film growth conditions are adjusted from those which are ideal for one surface to the ideal conditions for the second surface. This is accomplished by depositing a small fraction (preferably approximately 1%) of the required net film thickness under conditions for substrate material A, then continuously or incrementally adjusting the deposition condition toward the growth condition for substrate material B. This process continues until the conditions for substrate material B are reached; the bulk of the net required film is then deposited under these conditions. The deposited film remains homogeneous; i.e., only intrinsic stress is varied, while other film qualities, such as composition, orientation, etc., are unaffected.

Figure 1:
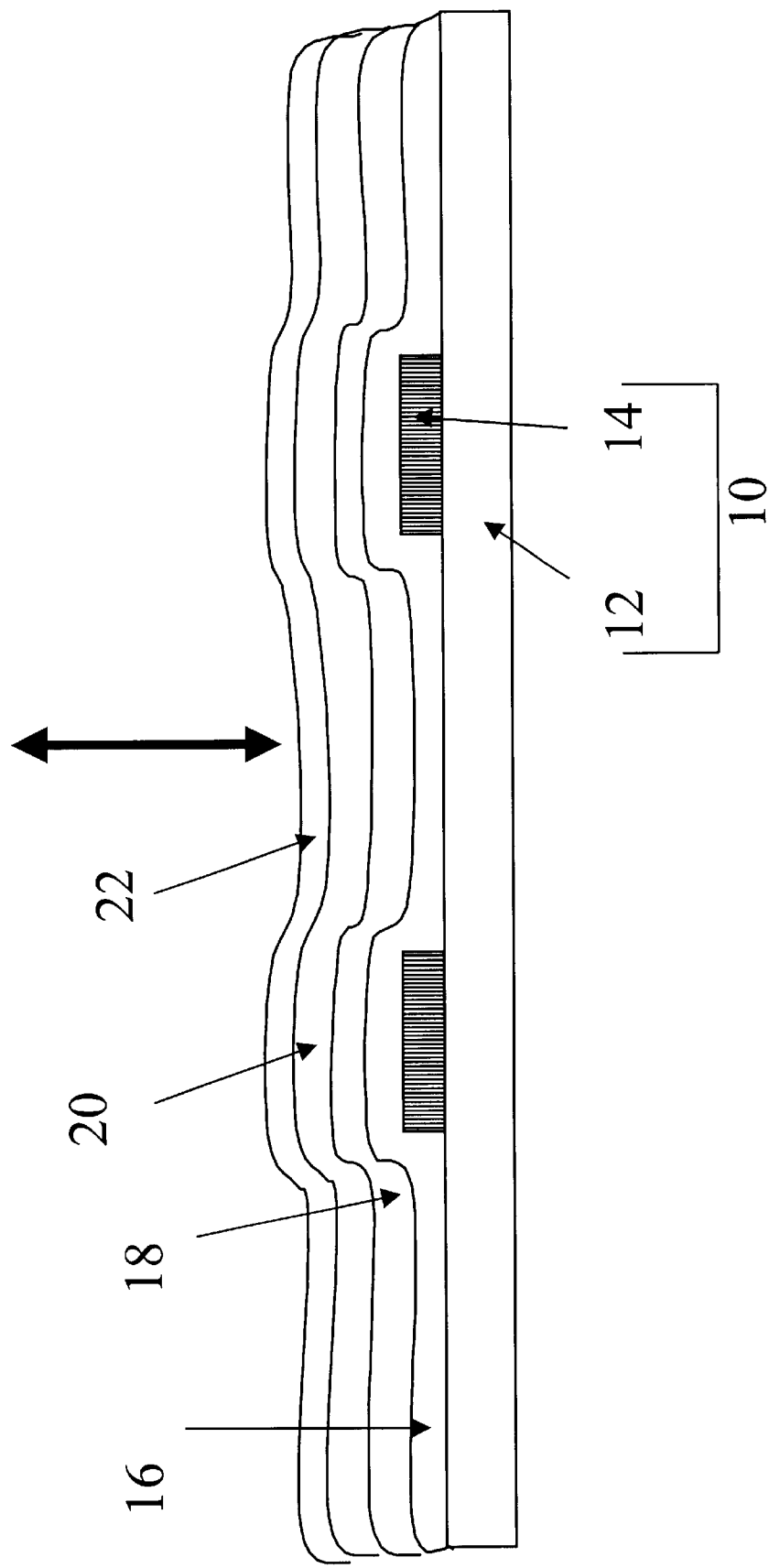
FIG. 1 shows the graded deposition of aluminum nitride on a patterned substrate after using the method of the present invention.

Referring to FIG. 1, a patterned substrate (10) is composed of at least two layers. These layers are made up of a first component material (12) and a second component material (14). Although there are only two component materials comprising the patterned substrate (10) in the figure, this is merely the minimum number of materials required to constitute the patterned substrate (10). The use of a more complex patterned substrate is also encompassed by the method of the present invention.

Preferred materials for the patterned substrate (10) depend on the electronic device being fabricated. In many applications, aluminum and homogeneous silicon form the patterned substrate (10). For bulk acoustic wave devices, materials include a concatenated aluminum electrode combined with low density silicon dioxide (for example, aerogel, created by a rapid liquid to solid phase transitions), low density CVD oxide (e.g.—non standard plasma-enhanced tetraethylorthosilane (PETEOS)), or spin-on polymer glass. For overmoded high-Q resonators or in some surface acoustic wave devices, the materials include a concatenated aluminum electrode combined with SiC, sapphire ($Al_2O_3$), $LiNbO_3$, $LiTaO_3$, or CVD diamond. Other metallic electrodes suitable for one of the materials of the patterned substrate (10) include platinum, tungsten, and gold.

In the figure, film layers (16), (18), and (20) are depositions of a film being deposited on the patterned substrate (10). Each of these layers has a thickness which is less than the total thickness of the film. Preferably, each layer constitutes approximately 1% of the total film thickness. Preferred materials for the film include aluminum nitride, aluminum oxide, tantalum oxide, silicon dioxide, silicon nitride, tantalum nitride, titanium nitride, zinc oxide, or any sputtered oxide or nitride that is being deposited with a small $T_s/T_m$ ratio, i.e., the ratio of the substrate temperature ($T_s$) to the melting temperature ($T_m$) of the deposited material. Film layer (22) is made of the same film material as layers (16), (18), and (20), but constitutes the bulk of the film being deposited. Except for the incremental or continuous changes in stress, the deposited film is homogeneous. Patterns in the figure do not represent specific materials, they have merely been added to differentiate the layers.

Figure 2:
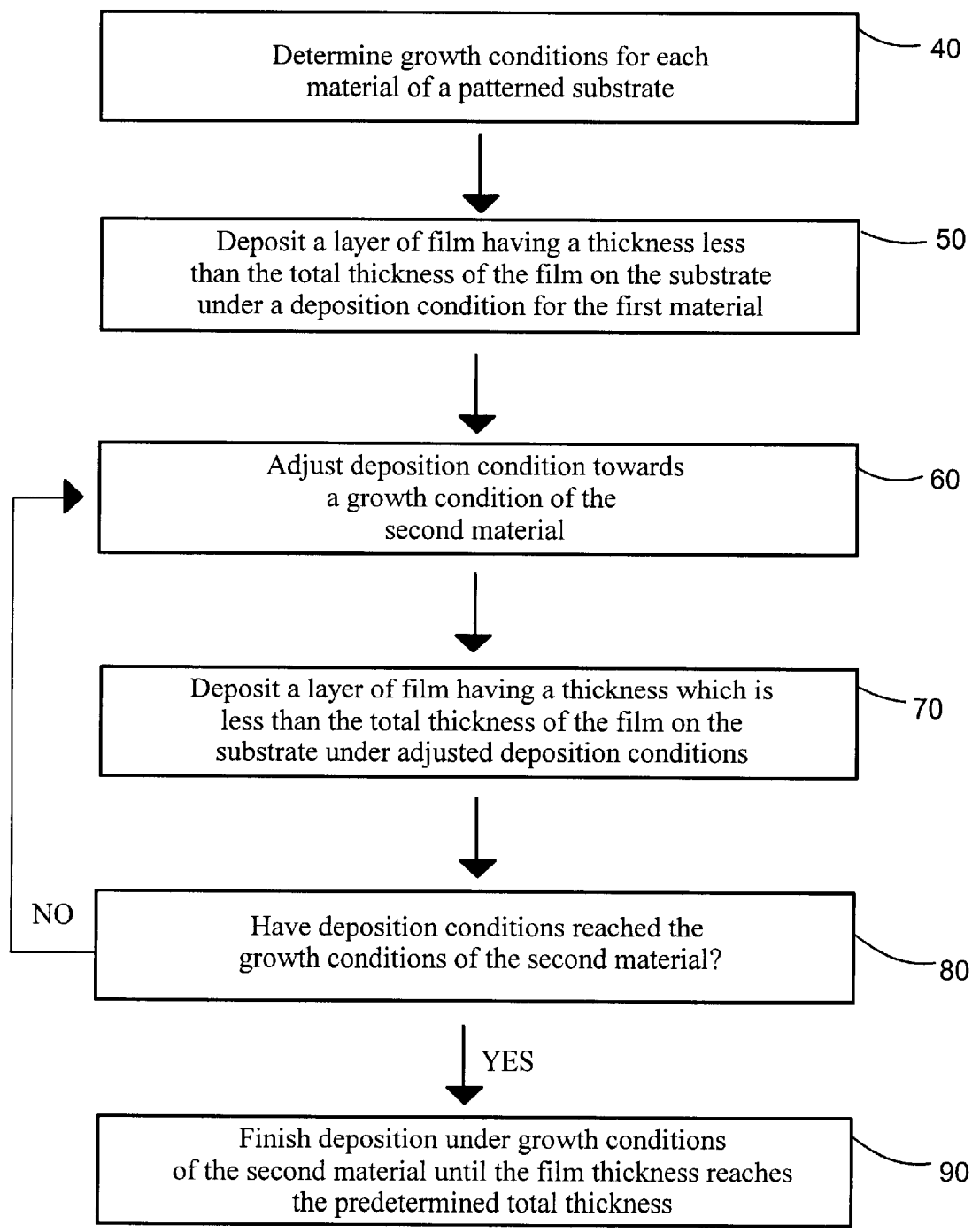
FIG. 2 shows a flowchart of the steps involved in the method of the present invention.

Referring to FIG. 2, the growth conditions of a patterned substrate (10) composed of a first component material (12) and a second component material (14) are determined for each material on the patterned substrate (10) in step (40). The growth conditions determined preferably minimize stress on each of the materials. The growth conditions determined are preferably the optimal growth conditions for each material. A film layer (16) having a thickness which is less than the total thickness of the film, preferably 1% of the total thickness of the film, is deposited in step (50) under a deposition condition which is set to the growth condition for the first component material (12) of the patterned substrate (10).

The deposition conditions are adjusted towards the growth conditions for the second component material (14) of the patterned substrate (10) in step (60), and an additional film layer (18) having a thickness which is less than the total thickness of the film, preferably approximately 1% of the total thickness of the film, is deposited under the adjusted deposition conditions in step (70). The adjustments in the deposition conditions are either incremental or continuous. Steps (60) and (70) are repeated to deposit additional film layer (20). The repetition of steps (60) and (70) occurs as often as is necessary to fulfill the requirement that at least one deposition condition becomes a growth condition on the second component material in step (80). When the growth conditions of the second component material are reached, the bulk of the film is deposited in step (90) under the growth conditions of the second material, thus creating the complete film layer (22).

A particular application of this method involves the deposition of a piezoelectric material such as aluminum nitride. The substrate is a binary surface of CVD Silicon nitride ($SiN_x$) and patterned aluminum. In this example, the piezoelectric aluminum nitride deposition is a step in the fabrication of a thin film resonator for a Bulk-Acoustical-Wave (BAW) device. The piezoelectric material is an essential, active component of the BAW device. It acts as a transducer between electrical and acoustic signals. The thinner the patterned substrate, the more difficult it is to deposit a piezoelectric film using prior art techniques without tearing apart the film. For example, membranes which are 0.1 microns or less in thickness are often used in BAW devices. The stresses encountered by the two materials composing the patterned substrate are sufficient to tear apart the membrane during deposition. The stresses are so strong that the membrane ruptures. The method of the present invention solves the problem of the unique stresses encountered when depositing a piezoelectric film on a very thin patterned substrate, such as a membrane.

In this example, a patterned substrate of aluminum and silicon nitride is provided. The deposition conditions for obtaining low stress aluminum nitride on each component substrate material in step (40) initially requires separate, independent depositions of AlN on each component material. A pre-measurement of the curvature of the substrate may be initially performed. Following blanket deposition of aluminum nitride, the substrate curvature may be measured again to extract the differential curvature induced by the stress in the deposited film. An alternative way to measure stress on a substrate is to utilize X-ray diffraction. In these preparatory steps, then, deposition conditions for each substrate material are independently determined.

There are several issues which may be considered when making a determination of which growth conditions to use when depositing the initial interface layer of the film. One issue is the relative ratio of areas of the two component materials which compose the patterned substrate. For example, if the aluminum electrode area is smaller relative to the total area of the silicon nitride, one may choose to deposit the bulk of the aluminum nitride film at the conditions of the silicon nitride. Another consideration is the relative mechanical strength of the binding layer. The aluminum nitride may be deposited under the desired growth conditions for the "softer" (smaller elastic modulus) component material first then graded to the desired growth conditions of the other component material. For example, aluminum is a "soft" (elastic modulus are quite different) metal as compared to silicon nitride. Both of these issues suggest that when aluminum nitride is deposited on a patterned substrate of aluminum and silicon nitride, one may choose to deposit the initial interface layer of aluminum nitride in step (50) under the growth conditions for aluminum.

The deposition conditions of step (50) are the preferred growth conditions for aluminum nitride on the aluminum electrode. For AlN on Al, these deposition conditions include a background pressure of approximately 3.0 millitorr (mtorr), a gas ratio (noble/reactive) of 1.32:1 (37/28) sccm, an input power to the source cathode of 3 kw (14 Amp constant current mode), a substrate morphology of 4 degree <111>aluminum or better, a source to substrate distance of approximately 75 mm, a substrate temperature of 200° C., a fixed magnetron source, a 10 inch diameter gas distribution ring (with 40 mil diameter holes drilled every 5 degrees along its circumference) mounted between an isolation and ground shield, a pumping speed determined by an adjustable gate valve set for reduced conduction, and pulse DC power supply variables of a pulse width (duty cycle) of 22%, a pulse frequency of 180 kHz, and magnitude of the positive pulse at a maximum of 70V. The method is also applicable if one chooses to start with the background pressure for low-stress deposition on silicon nitride.

In this example, stress grading is achieved by an adjustment of the deposition pressure. The working background pressure is initially set to 3.0 mtorr in step (60) by adjustment of the gate valve (not shown); subsequent changes in system pressure are also accomplished through adjustment of this valve. In the aluminum and silicon nitride example, the differential between optimal pressure on aluminum versus silicon nitride is 1.2 mtorr; thus, the background pressure is increased in step (60) toward 4.2 mtorr. The increase in background pressure occurs either incrementally or continuously. After each change in pressure, another deposition of a layer having a thickness less than the total thickness of the film, preferably approximately 1% of the total thickness of the film, is performed in step (70). When the pressure reaches approximately 4.2 mtorr (the ideal pressure for AlN deposition on SiN) in step (80), the remainder of the film is deposited in step (90).

Another technique that can be used to change the film stress is the application of substrate bias. The deposition may begin with no bias and grade to the optimum compressive stress state relative to the initial condition. Alternatively, the deposition starts with a bias condition that is compressive relative to the secondary surface and the bias is reduced to grade in the other direction (tensile). In the aluminum and silicon nitride example, the aluminum nitride deposition begins with a high substrate bias for the aluminum electrode. The substrate bias is decreased, thus driving the stress more tensile, to grade toward silicon nitride conditions.

As another example, pulse width (duty cycle) and the gas ratio (noble/reactive), as it applies to reactive sputter deposition processes, are adjusted concurrently to change the film stress. The response to changing these deposition conditions is dependent on system parameters including cathode design, chamber and shield configuration. In general, increasing the $N_2$ ratio will drive the film more compressive, while decreasing pulse width (positive pulse duty cycle) increases tensile film stress. These parameters may thus be used together to achieve the stress differential necessary for stress grading. However, other film characteristics such as index and density also change with these parameters.

Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

What is claimed is:

1. A method of depositing film layers, comprising:

providing a substrate composed of first and second materials;

determining a growth condition for each of said first and second materials; and depositing at least one film layer onto said first and second materials under a deposition condition that is based initially on the growth condition determined for said first material, wherein the deposition condition is thereafter adjusted based in part on the growth condition determined for said second component material in order to alleviate stress induced during the depositing step.

2. The method of claim 1, further comprising the steps of refining adjustments to the deposition condition until the deposition condition is based only on the growth condition determined for the second material; and repeating said steps of depositing and refining in order to deposit subsequent film layers until a bulk film layer is formed on said first and second materials.

3. The method of claim 1, wherein said refining step is either incremental or continuous, depending on an amount of stress induced during the depositing step.

4. The method of claim 1, wherein said step of determining growth conditions includes evaluating the relative ratio of surface area between the first and second materials that compose the substrate, and includes evaluating the mechanical strength of a film layer that is initially deposited on the substrate as a binding layer for subsequently deposited film layers.

5. The method of claim 1, further comprising determining deposition conditions for each of said first and second materials, the deposition conditions being independently determined for each of said first and second materials by blanket depositing a film separately over each of said first and second materials, and measuring the curvature of the substrate before and after said blanket deposition step to extract a differential curvature induced by stress in the deposition of the blanket film for each of said first and second materials, wherein the deposition condition is based on the differential curvature.

6. The method of claim 1, wherein a plurality of film layers are separately deposited to form a substantially homogenous bulk film on the first and second materials, and wherein each film layer is deposited at a thickness that is approximately 1% of an eventual thickness of the substantially homogenous bulk film.

7. The method of claim 1, wherein said determined growth condition for said first and second materials includes a background pressure used to deposit said at least one layer over each of said first and second materials, said background pressure being increased or decreased to change film stress when shifting deposition of said at least one film layer between said first and second materials.

8. The method of claim 1, wherein said determined growth condition for said first and second materials includes a substrate bias condition used to deposit said at least one layer over each of said first and second materials, said substrate bias being increased or decreased to change film stress when shifting deposition of said at least one film layer between said first and second materials.

9. The method of claim 1, wherein said determined growth condition for said first and second materials includes a pulse width and a gas ratio used to deposit said at least one layer over each of said first and second materials, said pulse width and gas cycle being concurrently adjusting to change film stress when shifting deposition of said at least one film layer between said first and second materials.

10. A method of depositing film layers, comprising:

providing a substrate composed of first and second materials;

depositing a fraction of a required net bulk film under a deposition condition that is based on growth conditions for said first material;

continuously or incrementally adjusting the deposition condition toward growth conditions for said second material until the growth conditions for said second material are reached, wherein a remainder of the required net bulk film is thereafter deposited under growth conditions for the second material.

11. The method of claim 10, wherein a plurality of film layers are separately deposited to form a substantially homogenous net bulk film on the first and second materials, and wherein each film layer is deposited at a thickness that is approximately 1% of an eventual thickness of the substantially homogenous net bulk film.

12. The method of claim 10, wherein said growth conditions for said first and second materials includes a background pressure used to deposit said fraction of a required net bulk film over each of said first and second materials, said background pressure being increased or decreased to change film stress when shifting deposition of said fraction of a required net bulk film between said first and second materials.

13. The method of claim 10, wherein said growth conditions for said first and second materials includes a substrate bias condition used to deposit said fraction of a required net bulk film over each of said first and second materials, said substrate bias being increased or decreased to change film stress when shifting deposition of said fraction of a required net bulk film between said first and second materials.

14. The method of claim 10, wherein said determined growth condition for said first and second materials includes a pulse width and a gas ratio used to deposit said fraction of a required net bulk film over each of said first and second materials, said pulse width and gas cycle being concurrently adjusting to change film stress when shifting deposition of said fraction of a required net bulk film between said first and second materials.

15. The method of claim 10, wherein the deposited net bulk film remain homogenous such that only intrinsic stress is varied, while film qualities such as composition and orientation remain unaffected.

* * * * *